(12) United States Patent
Itoh et al.

(10) Patent No.: US 7,205,757 B2
(45) Date of Patent: Apr. 17, 2007

(54) HIGH PRECISION CURRENT SENSOR

(75) Inventors: Tomoki Itoh, Nagoya (JP); Masato Ishihara, Anjo (JP)

(73) Assignee: Denso Corporation, Kariya (JP)

( * ) Notice: Subject to any disclaimer, the term of this patent is extended or adjusted under 35 U.S.C. 154(b) by 88 days.

(21) Appl. No.: 11/185,750

(22) Filed: Jul. 21, 2005

(65) Prior Publication Data

US 2006/0043960 A1    Mar. 2, 2006

(30) Foreign Application Priority Data

Sep. 2, 2004  (JP) .............................. 2004-255253
Sep. 2, 2004  (JP) .............................. 2004-255254

(51) Int. Cl.
*G01R 15/18* (2006.01)
(52) U.S. Cl. ................................. 324/117 R
(58) Field of Classification Search ...................... None
See application file for complete search history.

(56) References Cited

U.S. PATENT DOCUMENTS 5,874,848 A * 2/1999 Drafts et al. ................ 327/511

6,184,679 B1 * 2/2001 Popovic et al. ............. 324/251

FOREIGN PATENT DOCUMENTS

| JP | A-2002-286764 | 10/2002 |
| JP | A-2002-303642 | 10/2002 |
| JP | A-2002-350470 | 12/2002 |
| JP | A-2003-167009 | 6/2003 |
| JP | A-2004-245776 | 9/2004 |

OTHER PUBLICATIONS

U.S. Appl. No. 11/110,839, filed Apr. 21, 2005, Itoh.

* cited by examiner

*Primary Examiner*—Ha Tran Nguyen
*Assistant Examiner*—Trung Q. Nguyen
(74) *Attorney, Agent, or Firm*—Posz Law Group, PLC

(57) ABSTRACT

A current sensor for measuring an electric current flowing through a current bus bar includes: a magnetic core with an opening, through which the current bus bar passes with a predetermined interval; and a first magnetic sensor for detecting magnetic flux density in the magnetic core, the magnetic flux density generated by the electric current passing through the current bus bar. The magnetic core has a first gap and a second gap. The first magnetic sensor is disposed in the first gap. The second gap is capable of preventing magnetic saturation of the magnetic core.

10 Claims, 15 Drawing Sheets

HIGH PRECISION CURRENT SENSOR

CROSS REFERENCE TO RELATED APPLICATIONS

This application is based on Japanese Patent Applications No. 2004-255253 filed on Sep. 2, 2004, and No. 2004-255254 filed on Sep. 2, 2004, the disclosures of which are incorporated herein by references.

FIELD OF THE INVENTION

The present invention relates to a current sensor, and more particularly to high precision current sensor with a magnetic sensor.

BACKGROUND OF THE INVENTION

Electrical components mounted on automotive vehicles such as car navigation systems have increased in recent years. A current drain on car batteries has become too large accordingly, and a peak current has reached to several hundred amperes. A variety of technologies improving fuel economy have therefore applied to cars. An engine control system, which is one of the technologies, stops to operate a battery-charging generator under acceleration and operates the generator under deceleration. The engine control system requires precision detection capability of a battery current in order to control the battery charging properly.

FIG. 15 shows a conventional current sensor 10 for measuring a large current such as a battery current. The sensor 10 has a C-shaped magnetic core 20, a current bus bar 12 and a magnetic sensor 14. The core 20 has a center opening where the bar 12 passes through. A gap Ga1 is formed between both end surfaces of the core 20. The magnetic sensor 14 is disposed in the gap Ga1. The magnetic sensor 14 detects magnetic flux density in the gap Ga1 generated by a current flowing through the bar 12. Then, the magnetic sensor produces signals corresponding to the magnetic flux density. The sensor 10 receives the signals, and thereby can measures a current.

Current sensors such as the sensor 10 are disclosed, for example, in Japanese Patent Application Publication No. H14-286764, Japanese Patent Application Publication No. H14-303642, Japanese Patent Application Publication No. H15-167009, and Japanese Patent Application Publication No. 2002-350470.

A current sensor disclosed in Japanese Patent Application Publication No. H14-286764 uses magnetoimpedance devices (i.e., MI device) as magnetic sensing elements. In the sensor, sensitivity of a weak direct current is improved by applying alternating current to the MI devices.

A current sensor disclosed in Japanese Patent Application Publication No. H15-350470 uses two Hall effect ICs as magnetic sensing elements. One IC is for a large current, and the other IC is for a small current. The sensor automatically switches on and off between the two ICs according to an amount of current.

However, the sensor 10 shown in FIG. 15 measures a certain amount of current, even when no current flows. The measurement error of current is caused by magnetic hysteresis effect in the core 20, which is ferromagnetic. Specifically, when a large current flows through the bar 12, the core 20 is magnetized. Then, after the current stops and become zero, magnetic force generated by the current is removed. But some magnetic flux remains in the core 20 because of magnetic hysteresis effect. The remaining flux is defined as residual flux. The magnetic sensor 14 detects the residual flux, and consequently the sensor 30 measures an error current.

The measurement error can be corrected by storing fixed data corresponding to the error in ROM (Read-Only Memory), which is mounted on a current detection circuit of a current sensor, if a current flows in one direction. However, the error correcting method with ROM cannot be applied to a current sensor for measuring a battery current. This is because a battery current flows in both directions for charging and discharging a battery, and the residual flux density in the core 20 varies depending on the direction and magnitude of current. Consequently, it is difficult to correct a measurement error with ROM storing fixed data corresponding to the error.

The sensor 10 has another problem. When a large current of around several hundred amperes flows though the bar 12, magnetic flux density in the core 20 increases significantly and hysteresis effect is enhanced accordingly. Consequently, magnetic saturation occurs in the core 20 and the sensor 10 cannot measure an actual current.

SUMMARY OF THE INVENTION

In view of the above-described problem, it is an object of the present invention to provide a current sensor with which a large current can be accurately measured.

According to a first aspect of the present invention, the current sensor comprises a magnetic core, a first magnetic sensor, and a current bus bar. The magnetic core includes a center opening where the current bus bar is disposed so as to pass through. The magnetic core further includes a plurality of gaps, in one of which the first magnetic sensor is disposed. The other gaps are designed for preventing magnetic saturation in the core.

In the current sensor, the gaps increase magnetic flux leakage from the core, and thereby magnetic saturation can be prevented. Consequently, the current sensor can accurately measure a large current.

According to a second aspect of the present invention, the current sensor further comprises a second magnetic sensor disposed in one of the gaps.

In the current sensor with two magnetic sensors, a current is calculated on the basis of each output of the two magnetic sensors. The current calculation process corrects a measurement error caused by residual flux, and thereby the current sensor can accurately measure a large current.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 16:
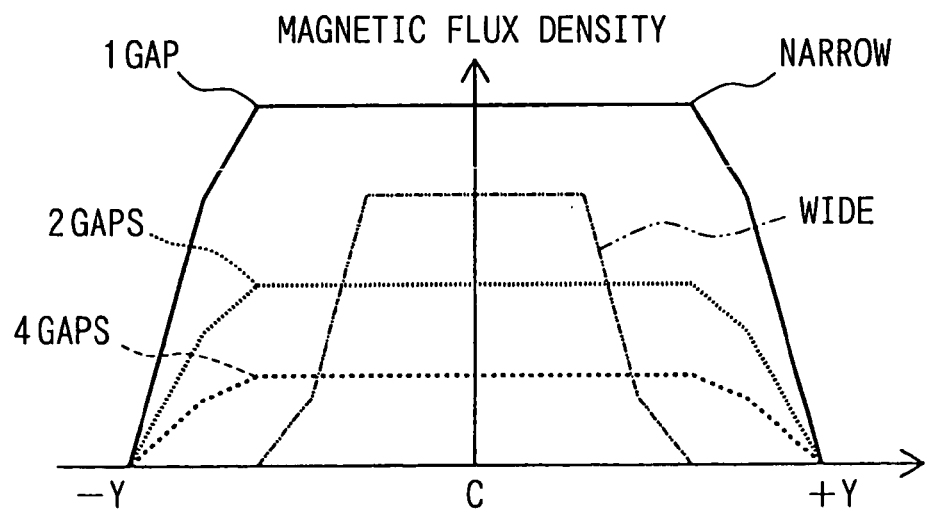
FIG. 16 is a simplified graph showing a relation between magnetic flux density and the density detected position in a gap.

The inventors have preliminary studies about a current sensor for improving magnetic saturation. There is a potential method for overcoming magnetic saturation. Expanding the width of the gap Ga1 of the sensor 10 increases leakage flux in the core 20, and thereby magnetic saturation can be prevented. However, this method requires that the magnetic sensor 14 is exactly disposed in a center of the gap Ga1. The reason is as follows:

Graphs illustrated in FIG. 16 show a relation between magnetic flux density and a position in the gap Ga1, when a given amount of current flows. A vertical axis represents magnetic flux density, and a horizontal axis represents a deviation from the center C of the gap Ga1 to ±Y direction. A solid line graph represents the sensor 10 with one gap Ga1. A chain double-dashed line graph represents a wider gap version of the sensor 10. The flat area in the middle of each graph indicates effective sensing area for the magnetic sensor 14. When the magnetic sensor 14 is disposed out of the area, wrong flux density can be detected.

In the sensor 10, although effective sensing area is wide, magnetic flux density is high. Consequently, magnetic saturation tends to occur in the core 20. In the wider gap version of the sensor 10, although magnetic flux density decreases, effective sensing area also decreases. Consequently, magnetic flux density cannot be accurately detected unless the magnetic sensor 14 is exactly disposed in the center C of the gap Ga1.

Figure 1A:
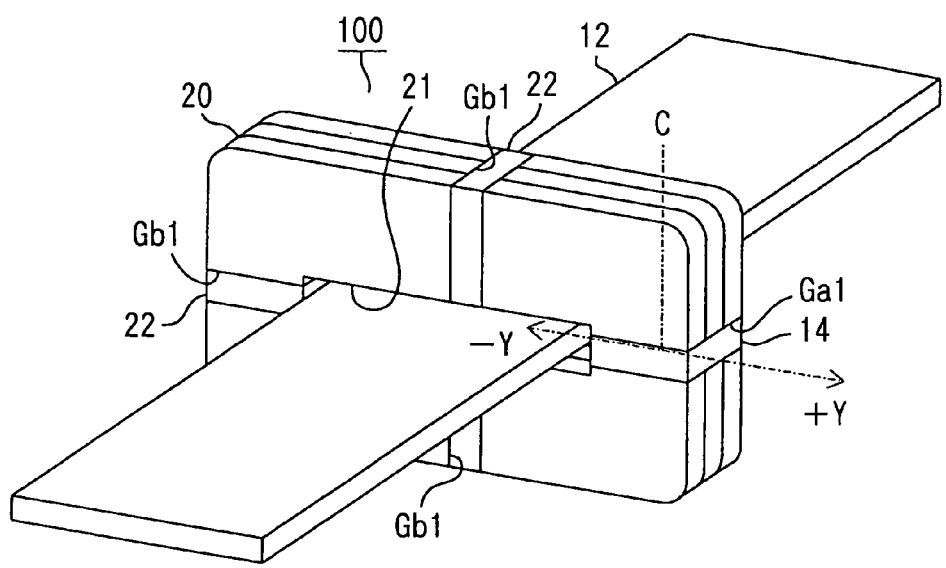
FIG. 1A is a perspective view showing a current sensor according to a first embodiment of the present invention.

FIG. 1A shows a current sensor 100 according to a first embodiment of the present invention. The sensor 100 is designed to measure a charging and discharging current of car batteries. The sensor 100 includes a magnetic core 20, a current bus bar 12 and a magnetic sensor 14. The core 20 has a center opening 21 and rounded corners. The core 20 is evenly divided into four pieces by four gaps. The four gaps are composed of a gap Ga1 and three gaps Gb1. The gap Ga1 and one of the gaps Gb1 divide the core 20 into upper and lower pieces. Likewise, the others of the gaps Gb1 divide the core 20 into right and left pieces. The magnetic sensor 14 is disposed in the gap Ga1, and bonding members 22 are disposed in the gaps Gb1, respectively. The magnetic sensor 14 can also serves as a bonding member, and thus the four pieces of the core 20 are integrated into the core 20 by the magnetic sensor and the bonding members 22. The bar 12 is disposed in a plane perpendicular to the core 20 and inserted in the opening 21 with a given space until the core 14 is positioned in the middle of the bar 12. The magnetic sensor 14 employs Hall effect devices as its magnetic sensing element and detects magnetic flux density in the gap Ga1 generated by a current flowing through the bar 12.

The gaps Gb1 are designed for preventing magnetic saturation in the core 20. When a large current flows through the bar 12, the magnetic flux density in the core 20 increases significantly. Then, the gaps Gb1 allow some magnetic flux leakage, and therefore, the magnetic flux density decreases. Consequently, magnetic saturation can be prevented.

Each of the gap Ga1 and the gaps Gb1 has a width of 1 mm. The bar 12 is made of high-conductive metal such as brass. The bar 12 has a width of 20 mm and a thickness of 2 mm. A current sensor housing (not shown) contains the core 20 including the bar 12 and the magnetic sensor 14.

Figure 1B:
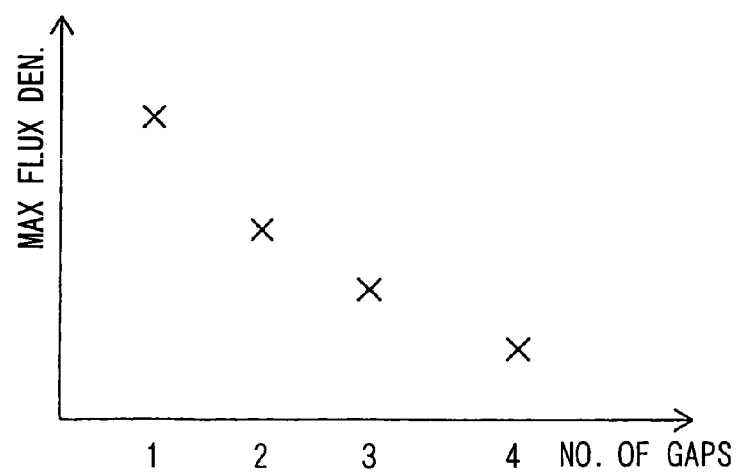
FIG. 1B is a simplified graph showing a relation between a total number of gaps and maximum flux density in a magnetic core.

A graph in FIG. 1B shows a relation between the number of the gaps (i.e., the number of divided pieces of the core) and maximum flux density in the core 20. The graph indicates that the maximum flux density is almost inversely proportional to the number of the gaps. In fact, maximum flux density of the sensor 100 with four gaps is reduced to a quarter compared to that of the sensor 10 with one gap.

As described above, the graphs illustrated in FIG. 14B shows a relation between magnetic flux density and the density detected position in the gap Ga1, when a given amount of current flows. The vertical axis represents magnetic flux density in the gap Ga1 and the horizontal axis represents a deviation from the gap center C to ±Y direction.

The solid line graph represents the sensor 10 with one gap Ga1. A chain line graph represents a two-gap type of the sensor 10. A dot line graph represents a four-gap type (i.e., the sensor 100) of the sensor 10.

Compared to the sensor 10 with one gap, magnetic flux density of the two-gap type is reduced to a half. Likewise, magnetic flux density of the four-gap type is reduced to a quarter. In other words, the graph indicates that magnetic flux density in the gap Ga1 is almost inversely proportional to the number of the gaps in the core 20. In the sensor 100 with four gaps, consequently, magnetic saturation may be prevented when a large current flows. Further, the graphs indicate there is no relation between the effective sensing area for the magnetic sensor 14 and the number of gaps in the core 20. The two-gap type and the sensor 100 have effective sensing area as large as the sensor 10. Specifically, the sensor 100 has a sufficient wide region to accommodate the sensor 14 in the gap Ga1.

As mentioned above, the sensor 100 can prevent magnetic saturation in the core 20 without decreasing the effective sensing area for the magnetic sensor 14. In addition, in the sensor 10, the magnetic flux in the core 20 reaches the maximum density in a position across the bar 12 from the gap Ga1. In the sensor 100, one of the gaps Gb1 is formed in the position, and thereby magnetic saturation is efficiently prevented. Consequently, the sensor 100 can correctly measure a large current.

The magnetic core 20 of the sensor 100 is manufactured as follows.

Figure 2A:
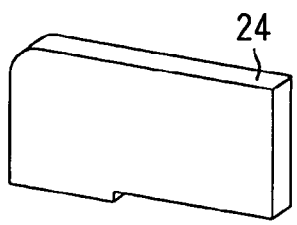
FIGS. 2A to 2D are perspective views explaining a manufacturing method of a magnetic core of the first embodiment.
Figure 2B:
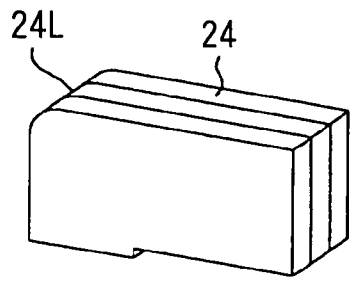
Figure 2C:
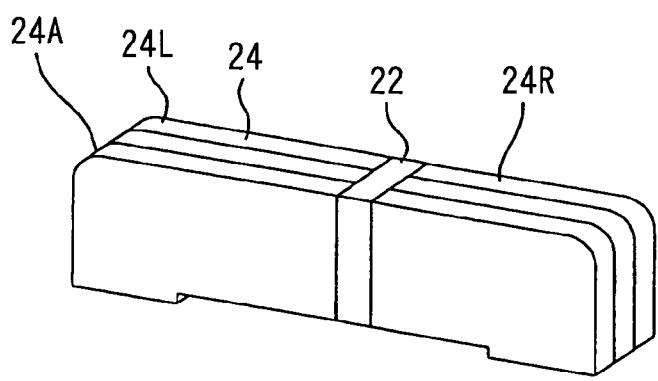
Figure 2D:
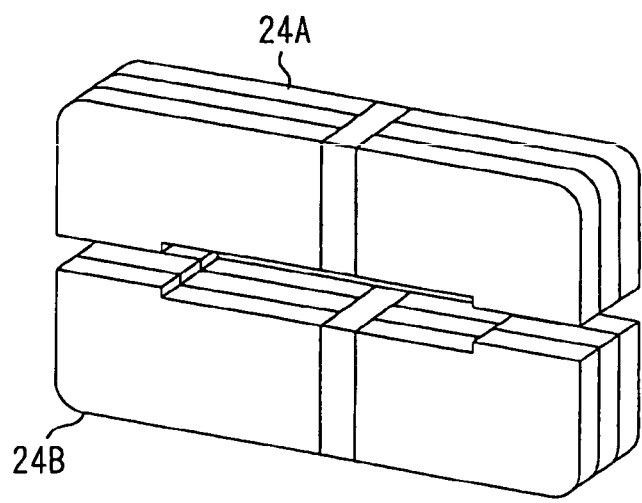

FIG. 2A shows a magnetic plate 24 with a predetermined shape. At first, an upper left piece 24L of the core 20 is manufactured by using multiple plates 24 (e.g., three plates). The plates 20 are pressed together into the piece 24L. Likewise, an upper right piece 24R is manufactured. Second, as shown in FIG. 2C, an upper half 24A of the core 20 is manufactured by using the piece 24L, the piece 24R and a bonding member 22 made of insulating resin. The bonding member 22 is sandwiched between one end surface of the piece 24L and one end surface of the piece 24R. The bonding member 22 has adhesive on both contact surfaces with the two pieces 24L, 24R. Thus, the two pieces 24L, 24R are bonded together into the upper half 24A by the bonding member 22. Likewise, a lower half 24B of the core 20 is manufactured. Finally, a core 24 shown in FIG. 1A is manufactured by using the upper half 24A, the lower half 24B, the bonding member 22 and a magnetic sensor 14. The bonding member 22 is sandwiched between one end surface of the upper half 24A and one end surface of the lower half 24B. The magnetic sensor 14 is sandwiched between the other end surface of the upper half 24A and the other end surface of the lower half 24B. The magnetic sensor 14 has adhesive on both contact surfaces with the two half 24A, 24B. Thus, the two half 24A, 24B are integrated into the core 20 by the bonding member 22 and the magnetic sensor 14. In the sensor 100, the gaps Ga1, Gb1 can be accurately formed in a predetermined width. That is because the magnetic sensors 14A and the bonding member 22 serve not only to bond the upper half 24A and the lower half 24B but also to form the gaps Ga1, Gb1.

Modifications of the First Embodiment

Several alternative modifications of the first embodiment are illustrated in FIGS. 3 to 7.

Figure 3A:
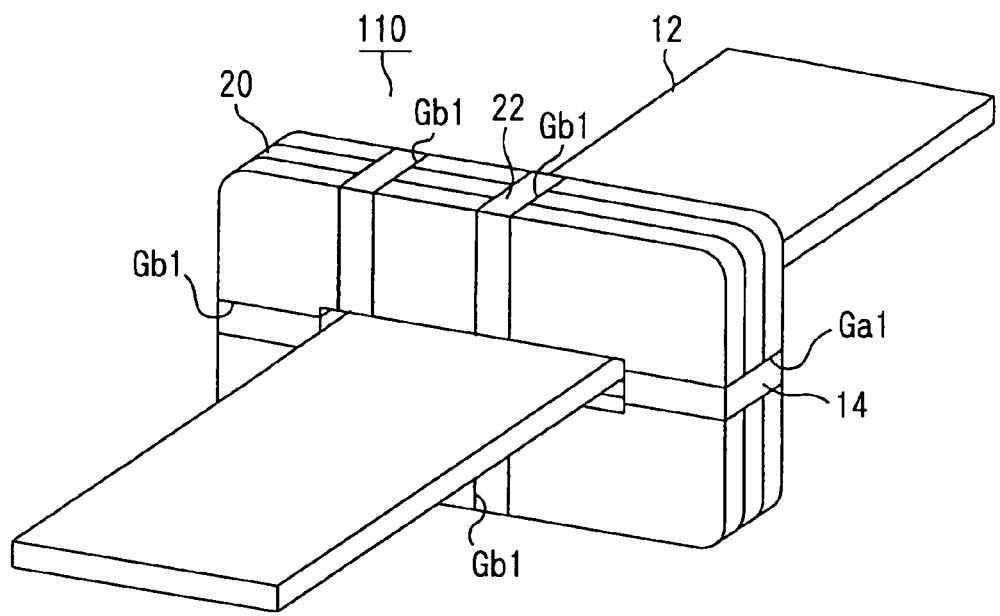
FIG. 3A is a perspective view showing a current sensor according to a first modification of the first embodiment.
Figure 3B:
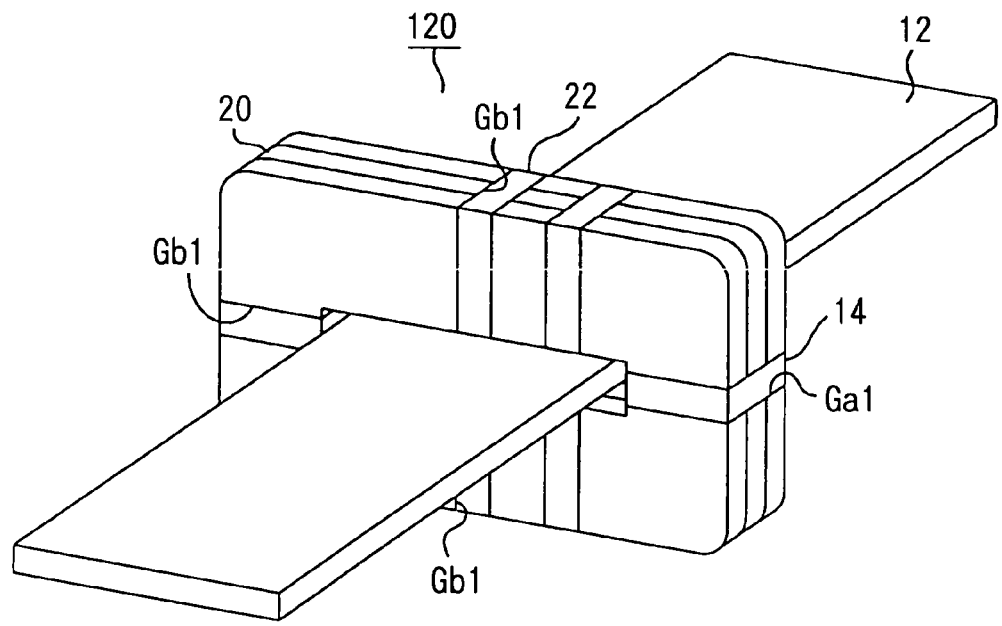
FIG. 3B is a perspective view showing a current sensor according to a second modification of the first embodiment.

A current sensor 110 shown in FIG. 3A has gap Ga1 and four gaps Gb1 in the core 20. The total gaps are five, and consequently maximum flux density in the core 20 is reduced to one-fifth compared to the sensor 10. Likewise, a current sensor 120 shown in FIG. 3B has gap Ga1 and five gaps Gb1 in the core 20. The total gaps are six, and consequently maximum flux density in the core 20 is reduced to one-sixth compared to the sensor 10.

Figure 4A:
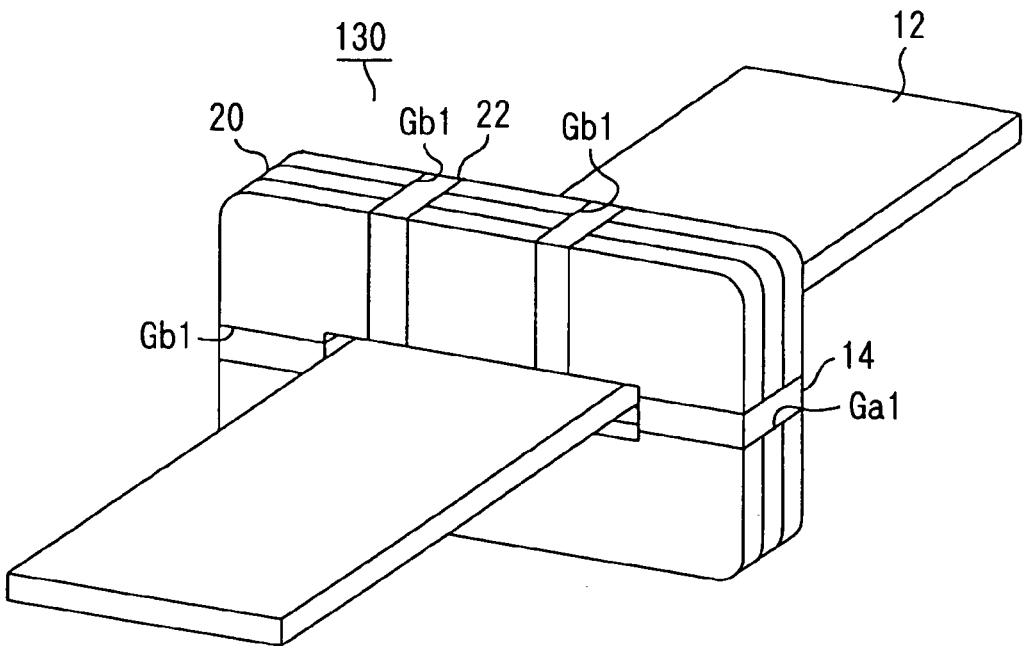
FIG. 4A is a perspective view showing a current sensor according to a third modification of the first embodiment.
Figure 4B:
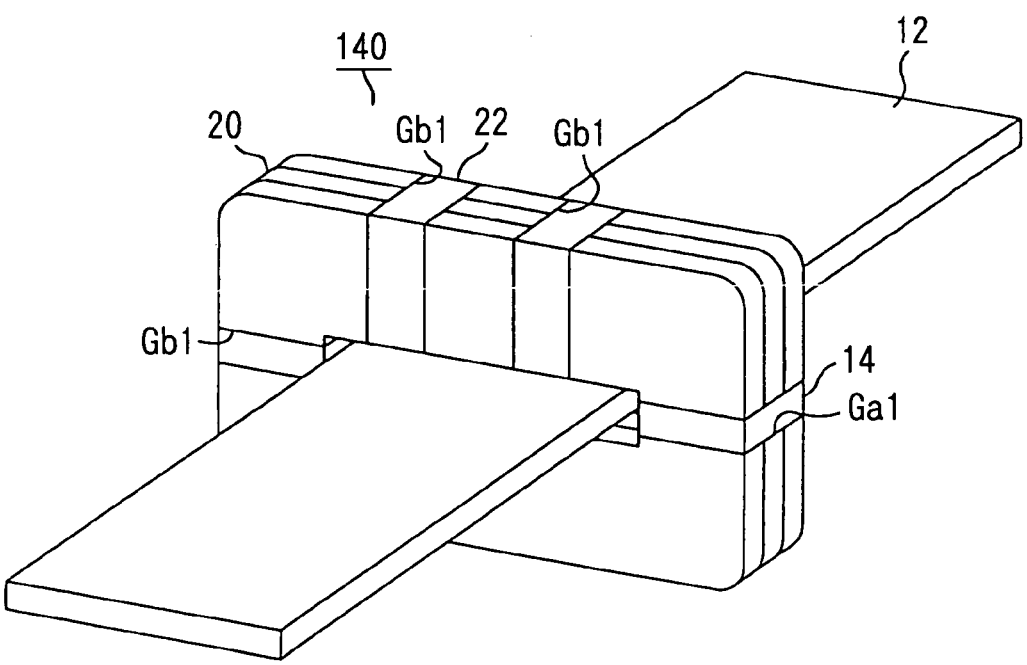
FIG. 4B is a perspective view showing a current sensor according to a forth modification of the first embodiment.

A current sensor 130 shown in FIG. 4A has gap Ga1 and three gaps Gb1 in the core 20. One of the gaps Gb1 is formed across the bar 12 from the gap Ga1 just as in the case of the sensor 100. But the others of the gaps Gb2 are formed over the bar 12. In other words, no gaps are formed under the bar 12. The gap-layout of the sensor 130 produces the same effect as the sensor 100 for reducing maximum flux density in the core. A current sensor 140 shown in FIG. 4B has the same gap-layout as the sensor 130. But the gaps Gb1 formed over the bar 12 has expanded widths. In the sensor 140, maximum flux density in the core 20 easily leaks from the expanded gaps Gb1, and consequently maximum flux density in the core 20 can be greatly reduced.

Figure 5A:
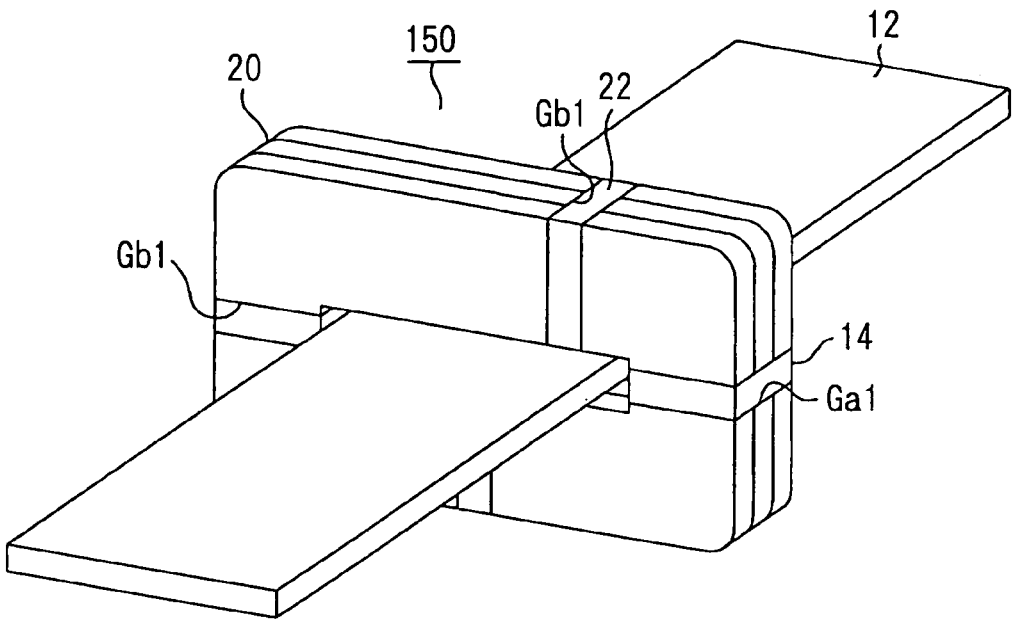
FIG. 5A is a perspective view showing a current sensor according to a fifth modification of the first embodiment.

In a current sensor 150 shown in FIG. 5A, the core 20 has gap Ga1 and three gaps Gb1 just as in the case of the sensor 100. Further, the gap-layout of the sensor 150 is similar to that of the sensor 100. But, in the sensor 150, the gap Gb1 formed over the bar 12 is not in the same line as the gap Gb1 formed under the bar 12. The gap-layout of the sensor 150 produces the same effect as the sensor 100 for reducing maximum flux density.

Figure 5B:
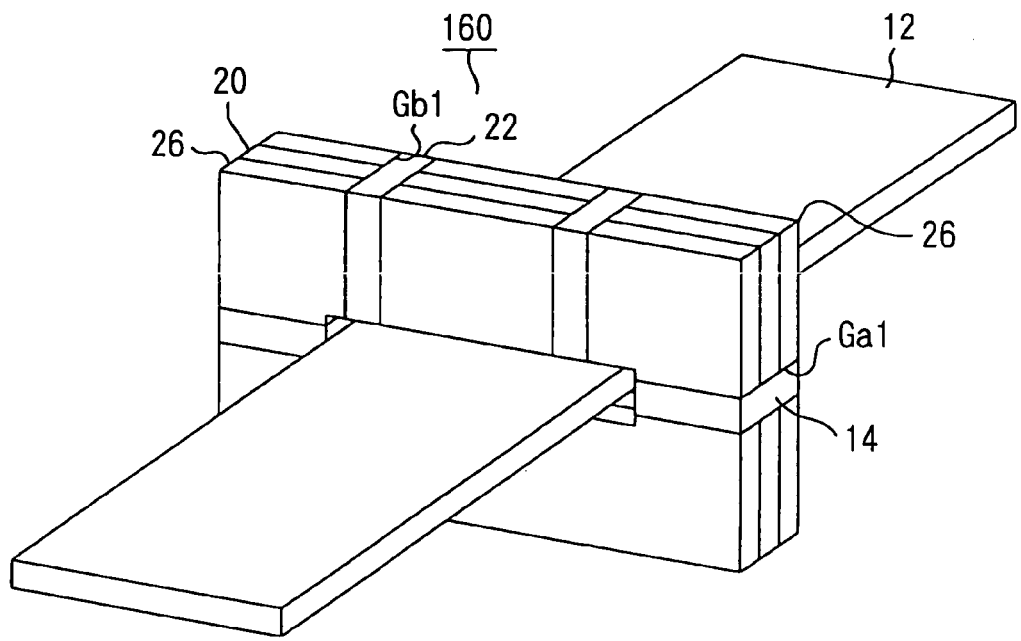
FIG. 5B is a perspective view showing a current sensor according to a sixth modification of the first embodiment.

In a current sensor 160 shown in FIG. 5B, the core 20 has sharp corners 26, whereas the core 20 of the sensor 100–150 has rounded corners. Magnetic flux leaks from the sharp corners 26 more easily than from rounded corners. Consequently, in the sensor 160, magnetic saturation in the core 20 can be prevented and a large current can be accurately measured.

Figure 6A:
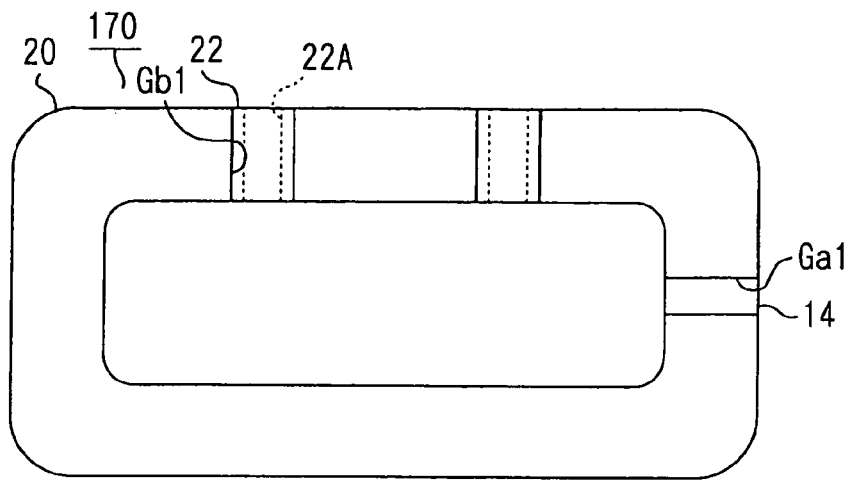
FIG. 6A is a side view showing a current sensor according to a seventh modification of the first embodiment.
Figure 6B:
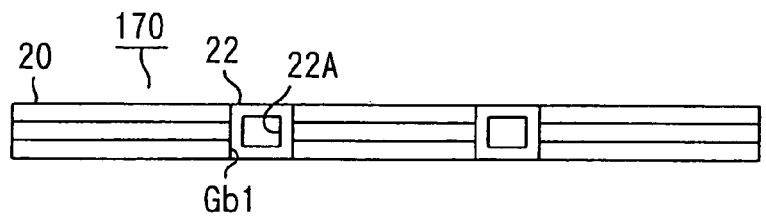
FIG. 6B is a top view showing a current sensor according to a seventh modification of the first embodiment.
Figure 6C:
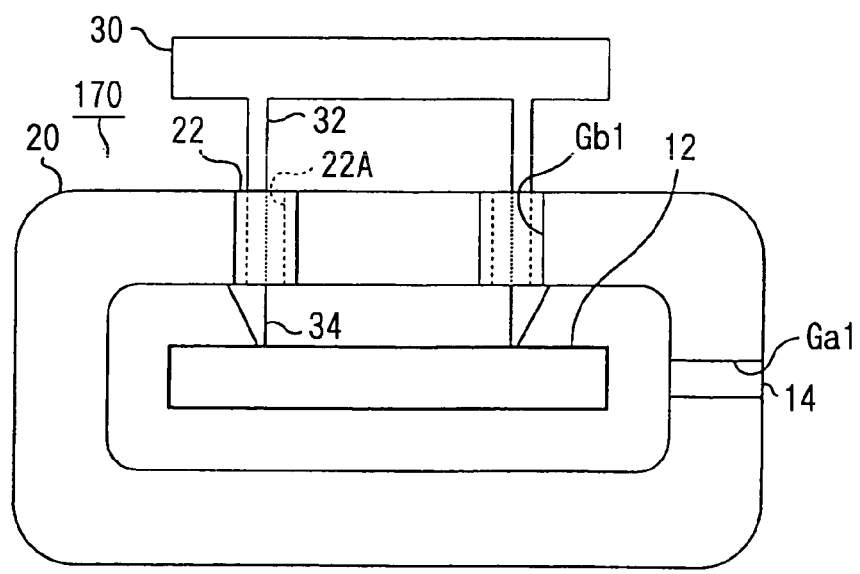
FIG. 6C is a side view showing a current sensor according to a seventh modification of the first embodiment attached to a mounting part.

In a current sensor 170 shown in FIGS. 6A to 6C, the core 20 has gap Ga1 and two gaps Gb1. Both of the gaps Gb1 are formed over the bar 12. The bonding members 22 are disposed in each gap Gb1, and besides, mounting holes 22A are formed inside each bonding members 22 as shown in FIG. 6B. A mounting part 30 shown in FIG. 6C is used for fixing the sensor 170 to an object such as a car. The mounting part 30 includes a common body and two junction portions 32 extending from the common body in one direction. Each junction portion 32 has a hook 34 on its tip. Each junction portion 32 is inserted into each mounting hole 22A in order to fix the core 20 to the mounting part 30. Then, each hook 34 catches the core 20, and thereby the core 20 can be fixed to the mounting part 30. Thus, the sensor 170 can be easily attached to an object.

Figure 7A:
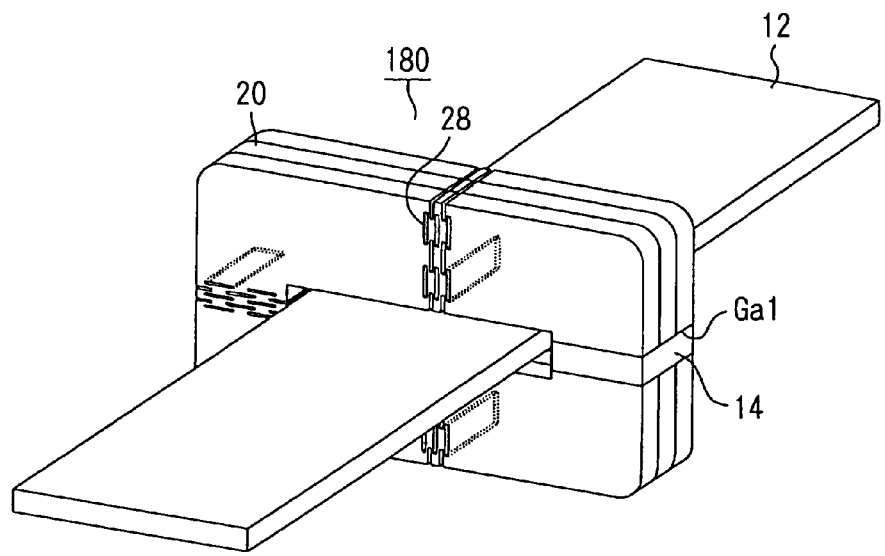
FIG. 7A is a perspective view showing a current sensor according to an eighth modification of the first embodiment.
Figure 7B:
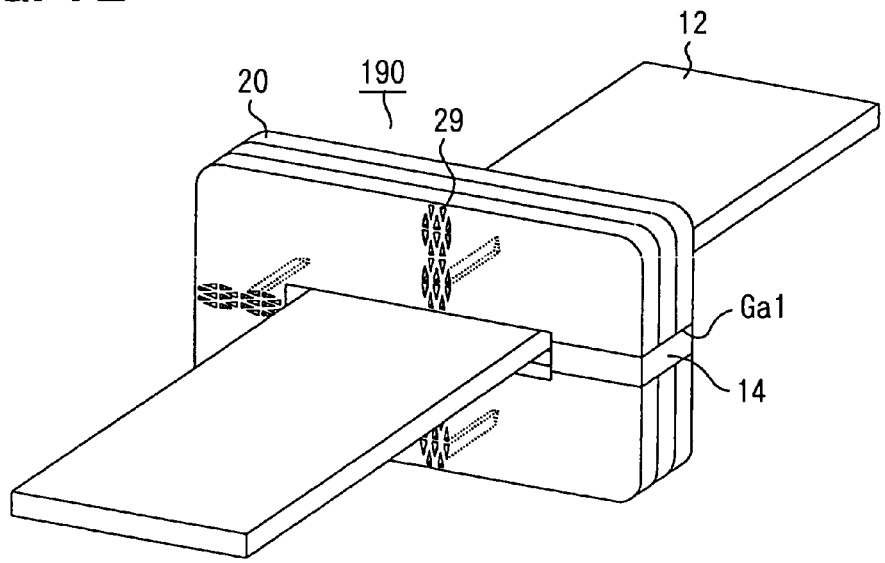
FIG. 7B is a perspective view showing a current sensor according to a ninth modification of the first embodiment.

In a current sensor 180 shown in FIG. 7A, the core 20 has rectangular slits 28 instead of the gaps Gb1 of the sensor 100. Some magnetic flux leaks from the slits 28, when a current flows. Each slit 28 is designed to overlap alternately in the direction of magnetic flux in the core 20 so that magnetic flux leakage increases. In other words, the slits 28 serve to prevent magnetic saturation as well as the gaps Gb1. In a current sensor 190 shown in FIG. 7B, the core 20 has triangular slits 29 instead of the rectangular slits 28 of the sensor 180. The triangular slits 29 are equal to the rectangular slits 28 in terms of the function of increasing magnetic flux leakage and preventing magnetic saturation. Therefore, the current sensors 180, 190 can accurately measure a large current.

Further, in the sensor 180, 190, the slits 28, 29 are formed in opposite side of the gap Ga1. As describe above, magnetic flux in the core 20 reaches the maximum density in opposite side of the gap Ga1. Consequently magnetic saturation is efficiently prevented and the sensor 180, 190 can correctly measure a large current.

Second Embodiment

Figure 8A:
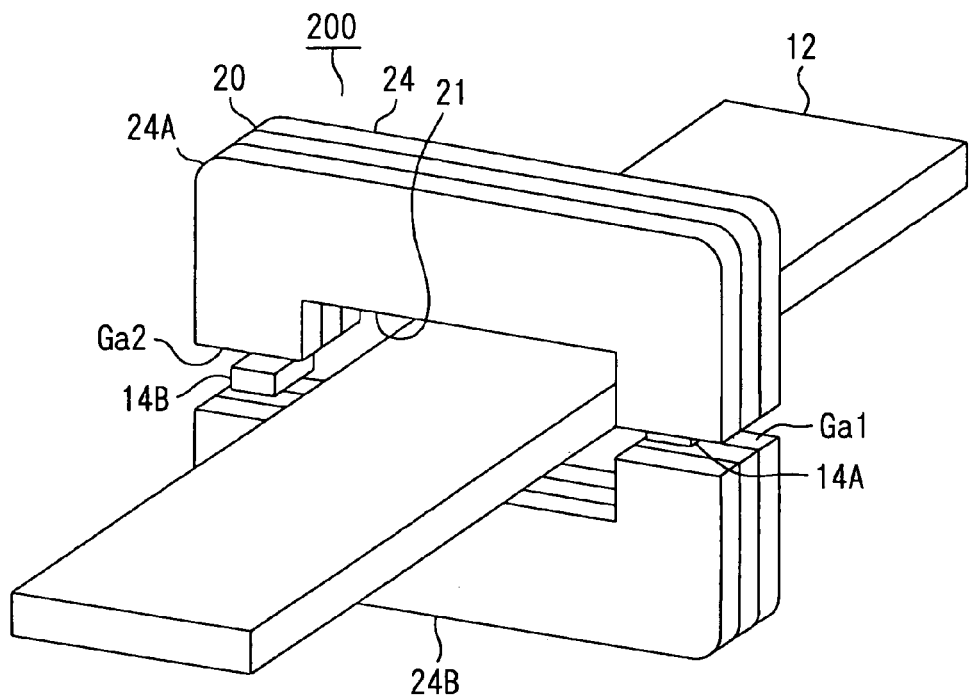
FIG. 8A is a perspective view showing a current sensor according to a second embodiment of the present invention.

A current sensor 200 according to a second embodiment of the present invention is shown in FIG. 8A. The sensor 200 is designed to measure a battery current. As shown in FIG. 8A, the sensor 200 includes a magnetic core 20, a current bus bar 12, a first magnetic sensor 14A and a second magnetic sensor 14B. The core 20 has a center opening 21 and two gaps Ga1, Ga2. The core 20 is evenly divided into an upper half 24A and a lower half 24B by the gaps Ga1, Ga2. The magnetic sensor 14A, 14B are disposed in the gaps Ga1, Ga2, respectively. The bar 12 is disposed in a plane perpendicular to the core 20 and inserted in the opening 21 with a given space until the core 20 is positioned in the middle of the bar 12. The magnetic sensors 14A, 14B detect magnetic flux density in the gaps Ga1, Ga2, respectively, generated by a current flowing through the bar 12.

The same Hall effect devices are employed in each magnetic sensor 14A, 14B as its magnetic sensing element. Consequently, the two magnetic sensor 14A, 14B have the same magnetic sensing capability. The gap Ga2 is wider than the gap Ga1, and the gaps Ga1, Ga2 have a width of 1 mm, 2 mm, respectively. The bar 12 is made of high-conductive metal such as brass. The bar 12 has a width W1 of 20 mm and a thickness H1 of 2 mm.

Figure 8B:
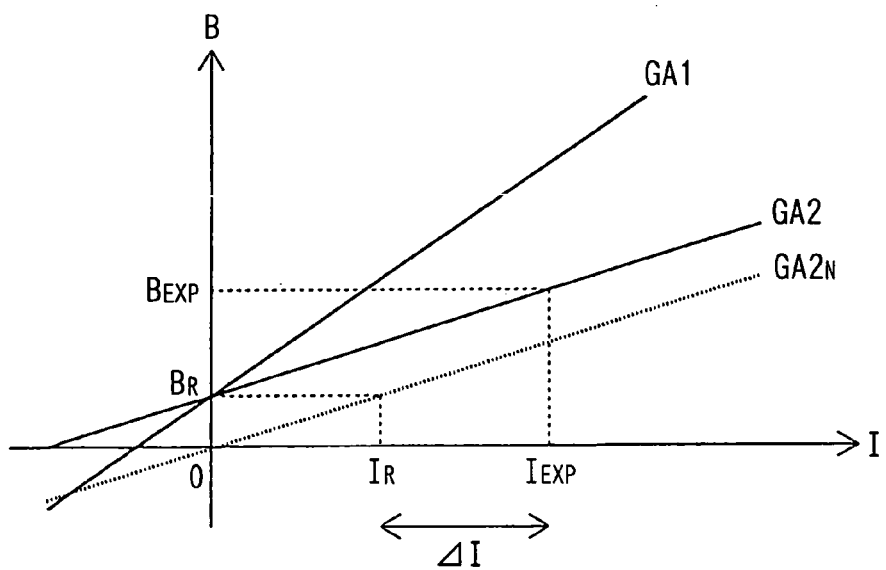
FIG. 8B is a simplified graph showing a relation between magnetic flux density and an amount of current in both a wide gap and a narrow gap.

Graphs illustrated in FIG. 8B show a relation between magnetic flux density in the gaps Ga1, Ga2 and an amount of current flowing through the bar 12. A vertical axis represents magnetic flux density B and a horizontal axis represents an amount of current I. Graphs GA1, GA2 represent magnetic flux density in the gap Ga1, Ga2, respectively. The graphs GA1, GA2 indicate that magnetic flux density in the gap Ga1 is higher than that in the gap Ga2, when a current flows. That is because the gap Ga2 is wider than the gap Ga1 and accordingly more magnetic flux leaks from the gap Ga2 than from the gap Ga1. Consequently, the magnetic sensor 14A detects more magnetic flux than the magnetic sensor 14B. That means the sensitivity of the magnetic sensor 14A to a current is higher than that of the magnetic sensor 14B.

The graph GA1, GA2 illustrated in FIG. 8B further indicate that magnetic flux density in the gap Ga1 is equal to that in the gap Ga2, when no current flows. In short, residual flux density $B_R$ in each gap Ga1, Ga2 is equal. The density $B_R$ caused by magnetic hysteresis effects result in a measurement error of current. Here, a graph $GA2_N$ in FIG. 8B represents magnetic density in the gap Ga2 on the assumption of no magnetic hysteresis effects in the core 20. As shown in the graphs in FIG. 8B, for instance, even when no current flows, the magnetic sensor 14B detects the density $B_R$ and the sensor 200 measures a current $I_R$ equivalent to the density $B_R$. Therefore, an actual current $I_C$ is obtained by subtracting the current $I_R$ from a current equivalent to the magnetic flux density detected on the magnetic sensor 14B. When the magnetic sensor 14B detects magnetic flux density $B_{EXP}$, the actual current $I_C$ is obtained by subtracting the current $I_R$ from a current $I_{EXP}$ equivalent to the magnetic flux density $B_{EXP}$ (i.e., $I_C = I_{EXP} - I_R$. In the FIG. 8B, the actual current $I_C$ is represented by $\Delta I$.

As described above, the magnetic sensor 14B detects magnetic flux density including the residual flux density $B_R$. Likewise, the magnetic sensor 14A detects magnetic flux density including the residual flux density $B_R$. Moreover, the magnetic flux density detected by each magnetic sensor 14A, 14B are different. That is, the magnetic sensors 14A, 14B produces two different outputs including the same residual flux density $B_R$. Therefore, the residual flux $B_R$ is eliminated by subtracting one output from the other output, and thereby an measurement error resulting from the residual flux $B_R$ can be corrected. Consequently, the sensor 200 can measure the actual current $I_C$, even if the residual flux density $B_R$ varies depending on the magnitude and direction of current flow.

Figure 9:
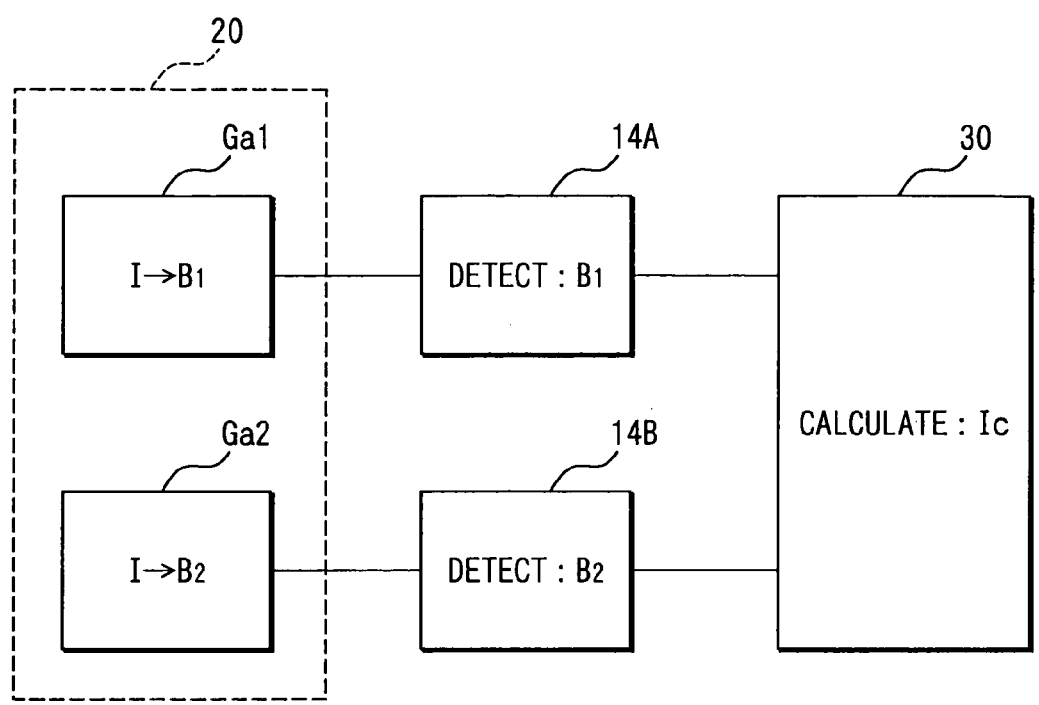
FIG. 9 is a flow chart showing an error correcting method for a current sensor according to the second embodiment.

FIG. 9 is a block diagram showing an error correcting method in the sensor 200. Each magnetic sensor 14A, 14B is connected to a current detection circuit 30. At first, a current I flowing through the bar 12 is converted to magnetic flux density B1, B2 in the gap Ga1, Ga2, respectively. Then, the magnetic sensor 14A, 14B detects the magnetic flux density $B_1$, $B_2$, respectively. Finally, the actual current $I_C$ is calculated from outputs of the magnetic sensor 14A, 14B through a current calculating process built in the current detection circuit 30. Here, the outputs of the magnetic sensor 14A, 14B are the magnetic flux density $B_1$, $B_2$, respectively. The current calculating process is explained below.

The magnetic flux density $B_1$, $B_2$ are represented by the following equations:

$$B_1 = X_A I_C + B_R \quad (1)$$

$$B_2 = X_B I_C + B_R \quad (2)$$

$I_C$ represents an actual current flowing through the bar 12; $X_A$ represents the sensitivity of the sensor 14A to the current; $X_B$ represents the sensitivity of the sensor 14B to the current; $B_R$ represents residual flux density in the gaps Ga1, Ga2.

The actual current $I_C$ can be calculated by the following equation derived from the above equations (1), (2).

$$I_C = (B_2 - B_1)/(X_A - X_B) \quad (3)$$

Figure 15:
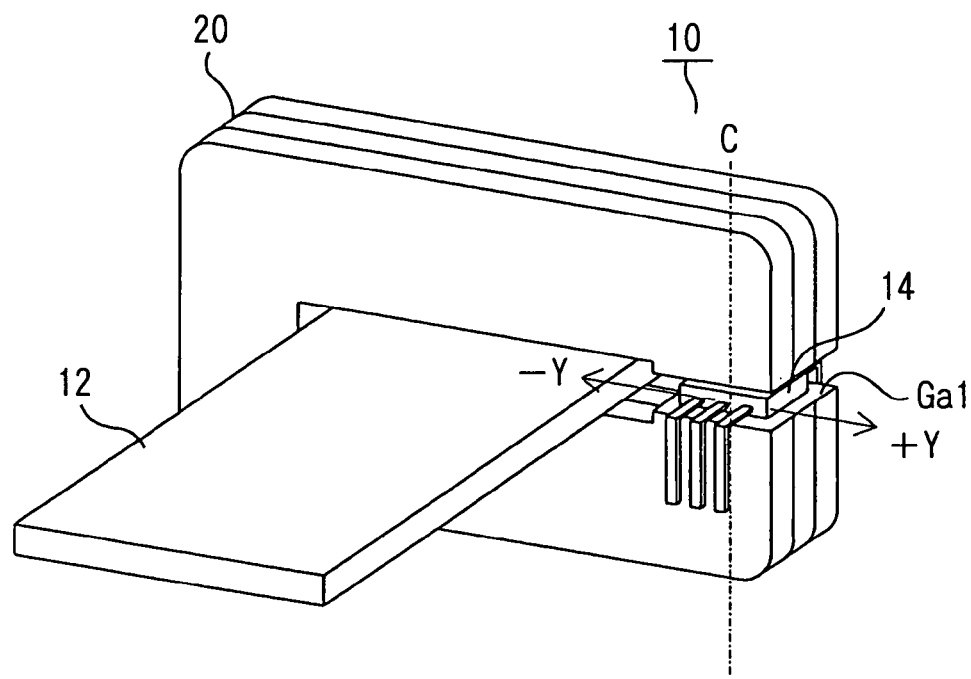
FIG. 15 is a perspective view showing a conventional current sensor according to a prior art.

In the sensor 10 according to prior art shown in FIG. 15, the magnetic flux in the core 20 reaches the maximum density in a position across the bar 12 from the gap Ga1. In the sensor 200, the gap Gb1 is formed in the position, and thereby magnetic saturation is efficiently prevented. Thus the current sensor 200 can overcome the problems resulting from not only residual flux density but also magnetic saturation. Consequently the current sensor 200 can correctly measure a large current.

Figure 10A:
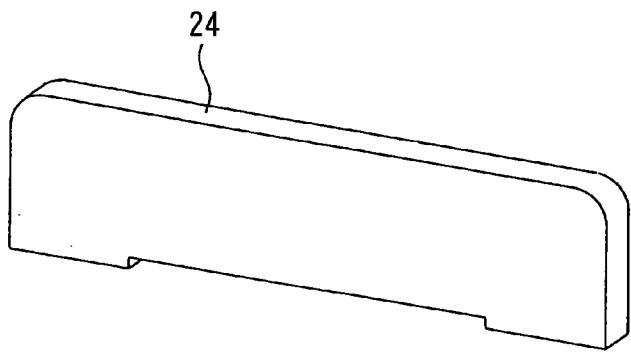
FIGS. 10A to 10C are perspective views explaining a manufacturing method of a magnetic core of the second embodiment.
Figure 10B:
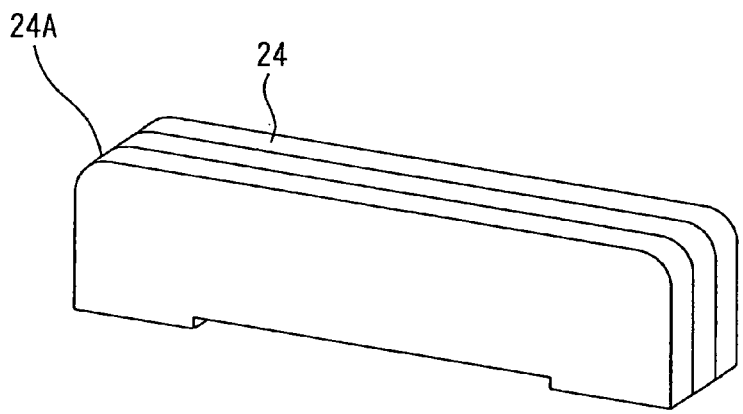
Figure 10C:
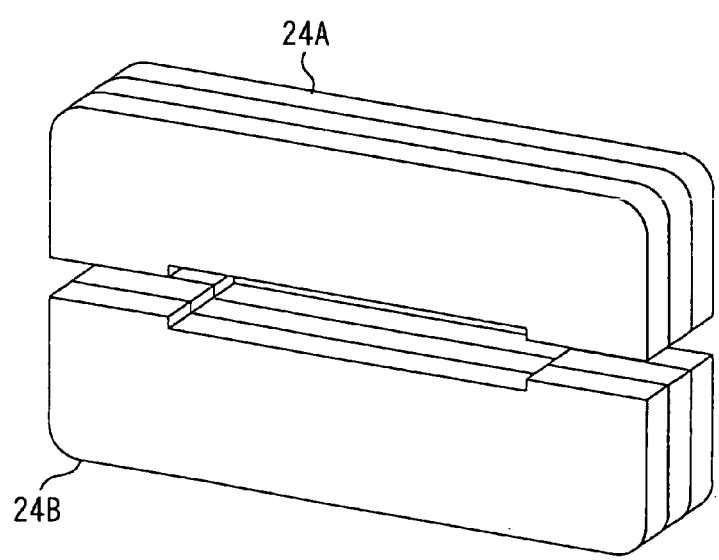

The magnetic core 20 of the sensor 200 is manufactured as follows:

FIG. 10A shows a magnetic plate 24 with a predetermined shape. At first, an upper half 24A of the core 20 is manufactured by using multiple plates 24 (e.g., three plates). As shown in FIG. 10B, the plates 24 are pressed together into the upper half 24A. Likewise, a lower half 24B is manufactured. Then, the upper half 24A are fixed above the bar 12 as shown in FIG. 8A. Likewise, the lower half 24B are fixed below the bar 12. Thus, the gap Ga1 is formed between one end surface of the upper half 24A and one end surface of the lower half 24B. Likewise, the gap Ga2 is formed between the other end surface of the upper half 24A and the other end surface of the lower half 24B. Finally, the magnetic sensor 14A, 14B is disposed in the gap Ga1, Ga2.

The sensor 200 can include multiple gaps Gb1 shown in FIGS. 1A and 3A–7B.

Modifications of the Second Embodiment

Figure 11:
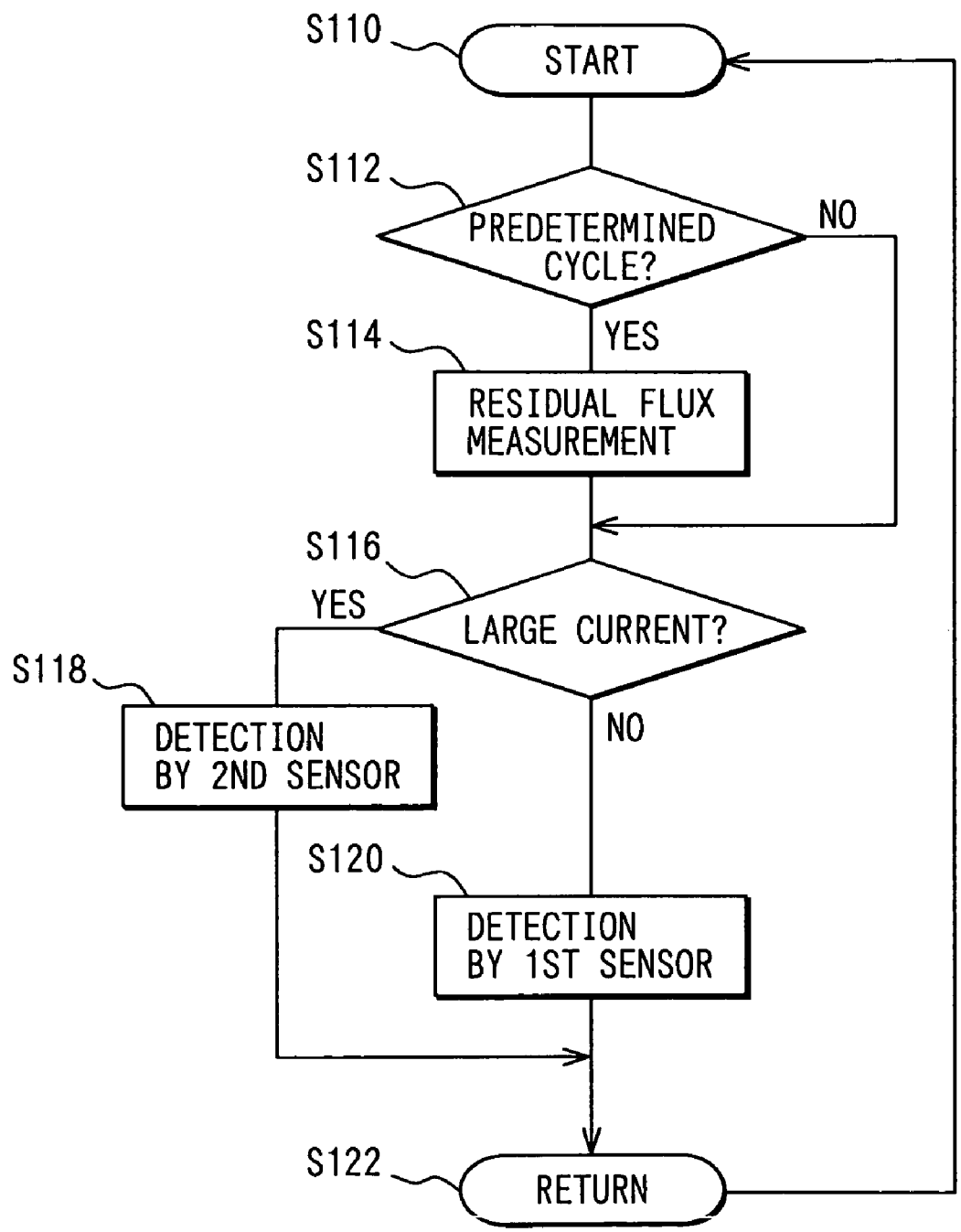
FIG. 11 is a flow chart showing an error correcting method for a current sensor according to a first modification of the second embodiment.

Several alternative modifications of the second embodiment are illustrated in FIGS. 11 to 12.

In the sensor 200, the current detection circuit 30 employs the current calculating process. The process calculates an actual current $I_C$ from the outputs of the magnetic sensors 14A, 14B.

FIG. 11 is a flow chart showing another current calculating process for the current detection circuit 30. The process starts at step S110. Then, at step S112, it is checked whether it is in a predetermined cycle. If it is in a predetermined cycle, the process proceeds to step S114, where the residual flux density $B_R$ is calculated from the outputs of the magnetic sensor 14A, 14B. Then, the process proceeds to step S116. If it is not in a predetermined cycle at step S112, the process skips step S114 and proceeds directly to step S116. At step S116, based on the output of the magnetic sensor 14B, it is checked whether the current is large (e.g., 10 amperes or more). If the current is large, the process proceeds to S118, where the actual current $I_C$ is calculated from the output of the sensor 14B with the residual flux density $B_R$. If the current is not large at step S116, the process proceeds to step S120, where the actual current $I_C$ is calculated from the output of the sensor 14A with the residual flux $B_R$. After step S118 or step S120 is finished, the process proceeds to step S122 and then returns to step S110.

As described above, in the sensor 200, the sensitivity of the magnetic sensor 14A to a current is higher than that of the magnetic sensor 14B. The process uses the sensor 14A for a small current and uses the sensor 14B for a large current. Thus, the sensor 200 employing the process has a wide range of current measurement capability from a small current to a large current with high accuracy.

Figure 12A:
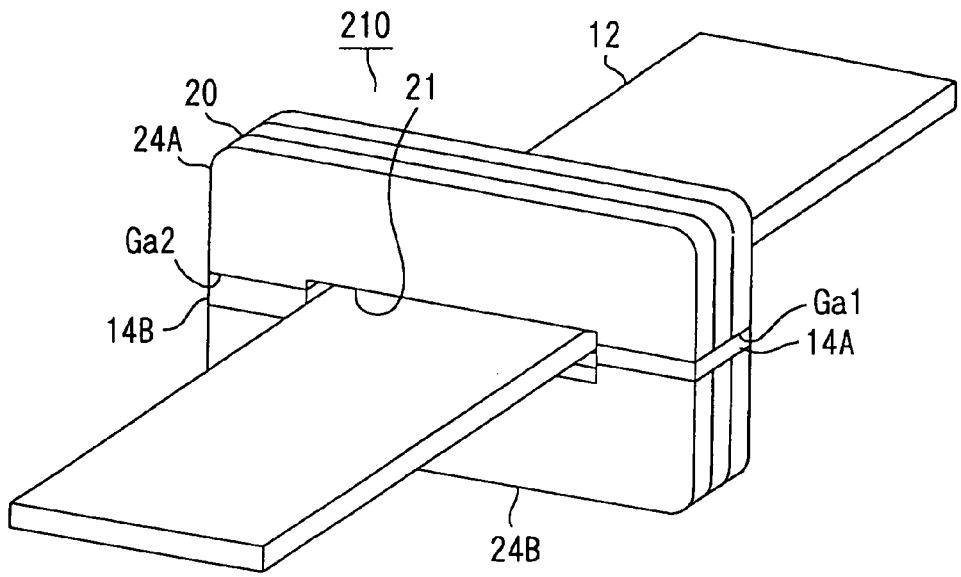
FIG. 12A is a perspective view showing a current sensor according to a second modification of the second embodiment.

FIG. 12A shows a current sensor 210 according to a modification of the sensor 200. In the sensor 210, the magnetic sensors 14A, 14B have a cubic shape with the same dimension as the gaps Ga1, Ga2, respectively. Consequently, the magnetic sensors 14A, 14B tightly fit into the gaps Ga1, Ga2, respectively. Further, each magnetic sensor 14A, 14B has adhesive on its both sides, where each magnetic sensor 14A, 14B contacts the upper half 24A and the lower half 24B. Thus, the upper half 24A and the lower half 24B are bonded together into the core 20 by each magnetic sensor 14A, 14B. In the sensor 210, the gaps Ga1, Ga2 can be accurately formed in a predetermined width. That is because the magnetic sensors 14A, 14B serve not only to joint the upper half 24A and the lower half 24B but also to form the gaps Ga1, Ga2.

The sensor 210 can include multiple gaps Gb1 shown in FIGS. 1A and 3A–7B.

Figure 12B:
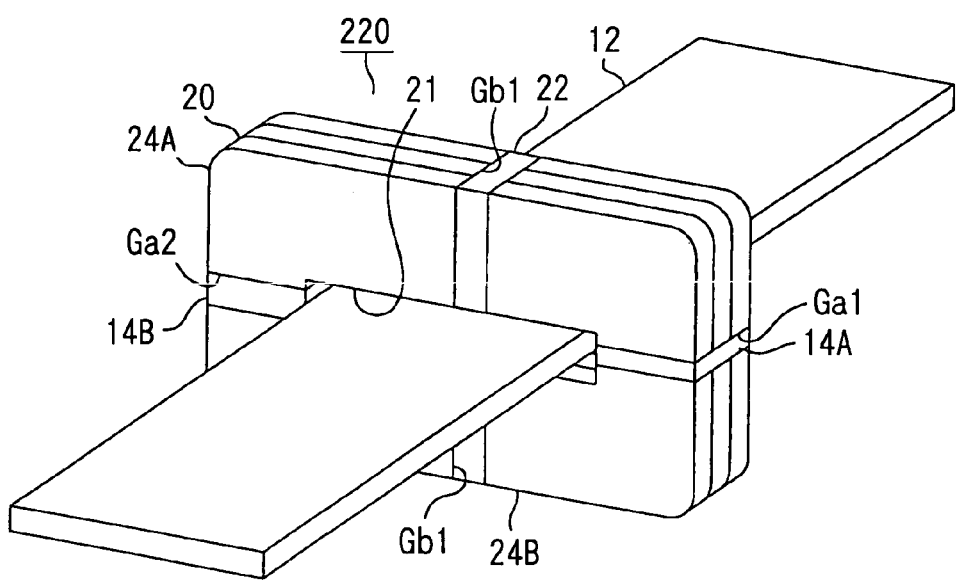
FIG. 12B is a perspective view showing a current sensor according to a third modification of the second embodiment.

FIG. 12B shows a current sensor 220 according to a modification of the sensor 210. The sensor 220 has another two gaps Gb1 in addition to the gaps Ga1, Ga2. Bonding materials 22 made of insulating resin are disposed in each gap Gb1. The gaps Gb1 are designed for preventing magnetic saturation in the core 20. The gaps Gb1 allow more magnetic flux leakage in the core 20, and thereby the magnetic saturation can be prevented. Consequently, the sensor 220 can accurately measure a large current.

The sensor 220 can include multiple gaps Gb1 shown in FIGS. 1A and 3A–7B.

Figure 13:
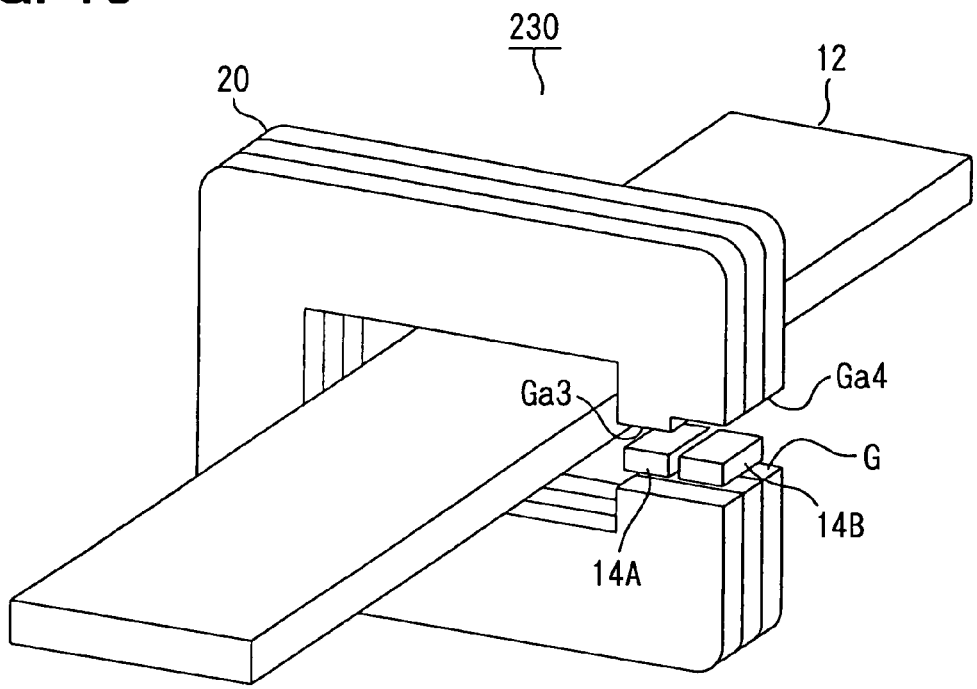
FIG. 13 is a perspective view showing a current sensor according to a fourth modification of the second embodiment.
Figure 14:
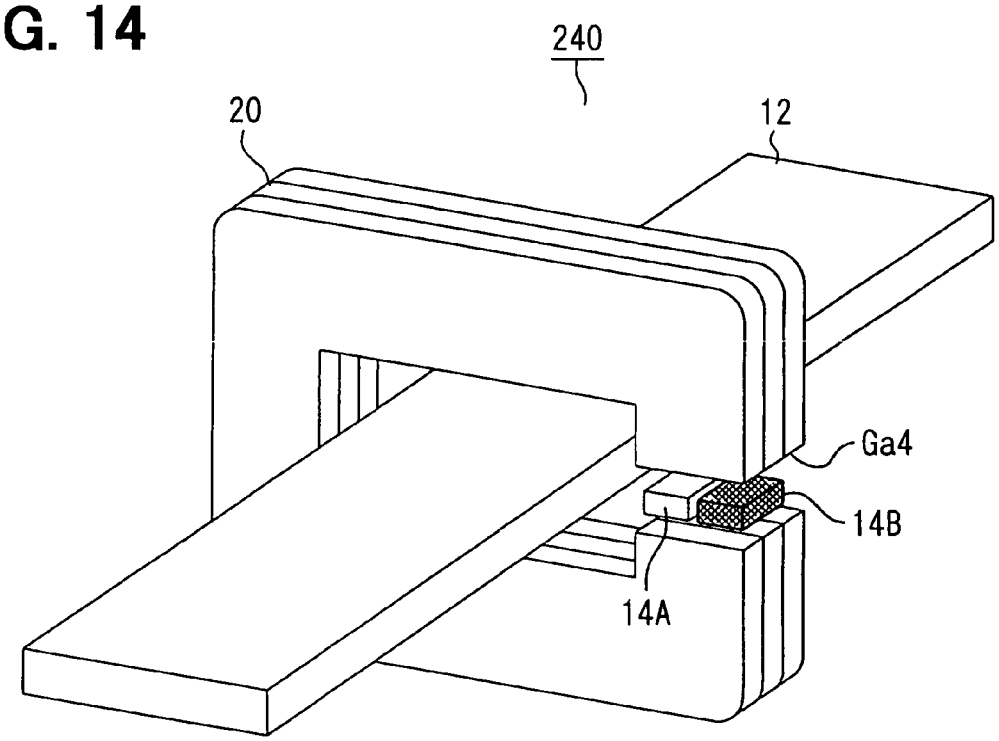
FIG. 14 is a perspective view showing a current sensor according to a fifth modification of the second embodiment.

Yet another embodiments of the sensor 200 are illustrated in FIGS. 13 to 14.

FIG. 13 shows a current sensor 230 according to another modification of the sensor 200. The sensor 230 has only one gap G in the core 20. The gap G is composed of different width gaps Ga3, Ga4. The gap Ga3 is narrower than the gap Ga4, and accordingly magnetic flux density in the gap Ga3 is higher than that in the gap Ga4. The magnetic sensors 14A, 14B are disposed in the gaps Ga3, Ga4, respectively. Each magnetic sensor 14A, 14B employs the same Hall effect devices as its magnetic sensing element, and consequently the two magnetic sensor 14A, 14B are identical in magnetic sensing capability. In the sensor 230, consequently, two magnetic sensors with the same magnetic sensing capability detect two different magnetic flux densities. In short, the different outputs can be produced from the magnetic sensors 14A, 14B, just as in the case of the sensor 200. Thus, the processes applied to the sensor 200 can be applied to the sensor 230, and thereby the sensor 230 can accurately measure a current without a measurement error caused by residual flux density. The sensors 230 are suitable for use in small current measurement The sensor 230 can include multiple gaps Gb1 shown in FIGS. 1A and 3A–7B.

FIG. 14 shows a current sensor 240 according to a modification of the sensor 230. There are two differences between the sensor 230 and the sensor 240. One difference is in their gap widths. The gap G of the sensor 240 has a uniform width all over the gap area, whereas the gap G of the sensor 230 has two different widths. In the sensor 240, consequently, magnetic flux density in the gap G is uniform all over the gap area. The other difference is in their magnetic sensors. In the sensor 230, the two magnetic sensors 14A, 14B have the same magnetic sensing capability. On the other hand, in the sensor 240, the two magnetic sensors 14A, 14B have the different magnetic sensing capability. In the sensor 240, consequently, the two magnetic sensors with the different magnetic sensing capability detect the same magnetic flux density. In short, two different outputs can be produced from the magnetic sensors 14A, 14B, just as in the case of the sensor 200. Thus, the processes applied to the sensor 200 can be applied to the sensor 240, and thereby the sensor 240 can accurately measure a current without a measurement error caused by residual flux density.

The sensor 240 can include multiple gaps Gb1 shown in FIGS. 1A and 3A–7B.

The sensors 230, 240 are suitable for use in small current measurement and can be easily manufactured because of their one-piece core.

In the all above-mentioned embodiments according to the present invention, magnetic sensors can adopt magnetoresistance devices as their magnetic sensing elements in place of Hall effect devices.

Third Embodiment

Figure 17:
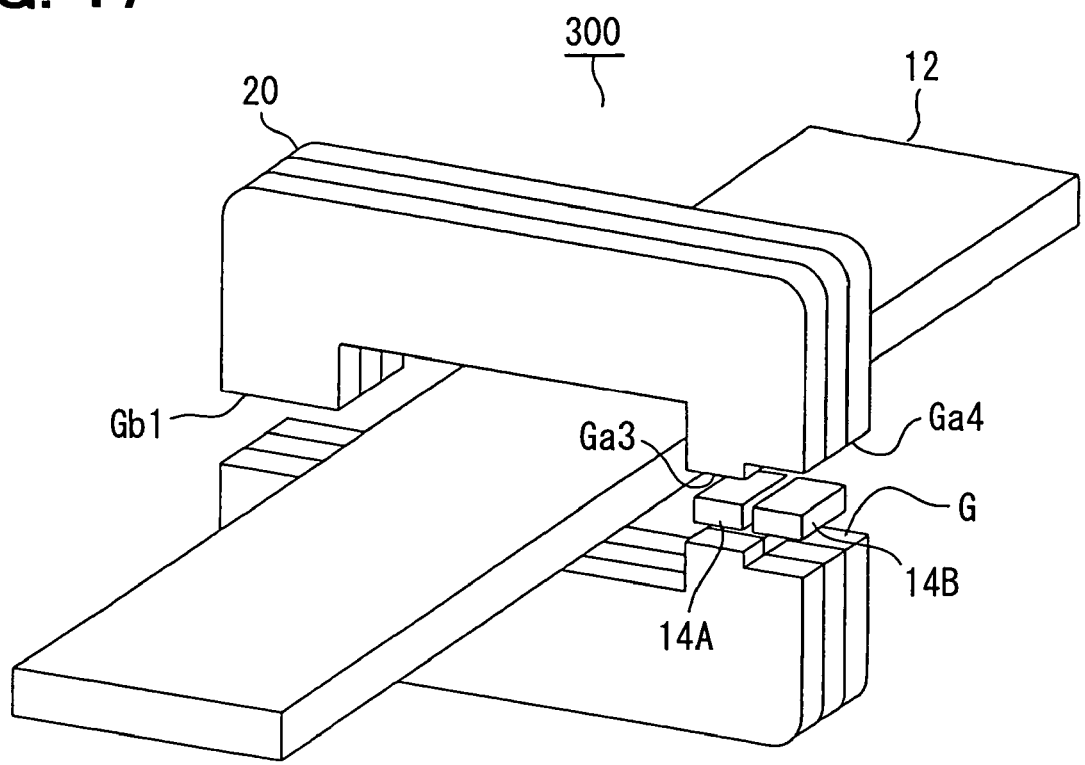
FIG. 17 is a perspective view showing a current sensor according to a third embodiment of the present invention.

A current sensor 300 according to a third embodiment of the present invention is shown in FIG. 17. The sensor 300 includes two gaps G, Gb1. One of the gaps G is composed of different width gaps Ga3, Ga4, which is similar to the sensor 230 shown in FIG. 13. The other one of gaps Gb1 is disposed opposite to the gap G, which is similar to the sensor 100 shown in FIG. 1A. Here, the sensor 300 can include multiple gaps Gb1 shown in FIG. 1A. For example, the sensor 300 can include three gaps Gb1.

Thus, the sensor 300 according to the third embodiment is formed to combine the sensor 100 according to the first embodiment and the sensor 230 according to the second embodiment. Here, in the sensor 100 according to the first embodiment, the magnetic core 20 is divided into multiple parts so that the magnetic saturation is reduced. Therefore, to flow a large current in the core 20, it is required to increase the number of the parts. However, when the sensor 100 includes the large number of the parts, the manufacturing steps for the sensor 100 are increased. Further, it is difficult to determine the positioning of the parts accurately. Further, in case of the sensor 100 shown in FIGS. 7A and 7B, the area of the slits 28, 29 is increased as the number of the parts is increased. Thus, the mechanical strength of the core 20 is reduced. Therefore, the number of the parts is limited to a certain number.

The sensor 230 according to the second embodiment includes two sensors 14A, 14B, which output sensor signals, respectively. Then, two signals are processed appropriately so that the sensor 230 can accurately measure a current without a measurement error caused by residual flux density. Specifically, a zero fluctuation caused by magnetic saturation is cancelled. To increase the current flowing through the core 20, it is required to increase the gap widely. However, the increase of the gap widely causes to narrow the flat portion in the magnetic field, as shown in FIG. 16. In this case, it is difficult to determine the positioning of the magnetic sensor 14B.

The sensor 300 can perform to detect the large current and to detect the current accurately, since the sensor 300 provides the merits of the first embodiment and the second embodiment.

Such changes and modifications are to be understood as being within the scope of the present invention as defined by the appended claims.

What is claimed is:

1. A current sensor for measuring an electric current flowing through a current bus bar comprising:
   a magnetic core with an opening, through which the current bus bar passes with a predetermined interval;
   a first magnetic sensor for detecting magnetic flux density in the magnetic core, the magnetic flux density generated by the electric current passing through the current bus bar, wherein
   the magnetic core has a first gap and a second gap, the first magnetic sensor is disposed in the first gap, and the second gap is capable of preventing magnetic saturation of the magnetic core;
   a second magnetic sensor for detecting magnetic flux density in the magnetic core, the magnetic flux density generated by the electric current passing through the current bus; and
   a current detection circuit coupled to the first and the second magnetic sensors, wherein the second magnetic sensor is disposed in the second gap, and the current detection circuit compensates for an effect of residual flux density in the magnetic core on the basis of outputs of the first and the second magnetic sensors.

2. The current sensor according to claim 1, wherein the second gap is disposed on an opposite side of the first gap.

3. The current sensor according to claim 1, wherein the magnetic core further includes a plurality of gaps except the first and the second gaps, and the plurality of gaps are capable of preventing magnetic saturation of the magnetic core.

4. The current sensor according to claim 3, further comprising:
   a bonding member disposed in at least one of the gaps except the first gap.

5. The current sensor according to claim 4, wherein the bonding member provides a mounting portion for mounting the magnetic core to an external object.

6. The current sensor according to claim 4, wherein the first magnetic sensor has dimensions equal to dimensions of the first gap, and the magnetic core, the first magnetic sensor and the bonding member provides one-piece core.

7. The current sensor according to claim 1, wherein the magnetic core has rectangular shape with four sharp corners, and the magnetic core is disposed in a plane perpendicular to the current bus bar.

8. The current sensor according to claim 1, wherein the second gap is wider than the first gap.

9. The current sensor according to claim 8, wherein the second gap is disposed on an opposite side of the first gap.

10. The current sensor according to claim 8, wherein the magnetic core further includes a plurality of gaps except the first and the second gaps, and the plurality of gaps are capable of preventing magnetic saturation of the magnetic core.

* * * * *